United States Patent
Demkov et al.

(10) Patent No.: US 6,791,125 B2
(45) Date of Patent: Sep. 14, 2004

(54) SEMICONDUCTOR DEVICE STRUCTURES WHICH UTILIZE METAL SULFIDES

(75) Inventors: Alexander A. Demkov, Phoenix, AZ (US); Kurt W. Eisenbeiser, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/261,370

(22) Filed: Sep. 30, 2002

(65) Prior Publication Data

US 2004/0061188 A1 Apr. 1, 2004

(51) Int. Cl.[7] .......................................... H01L 31/0328
(52) U.S. Cl. ..................... 257/192; 257/406; 257/410; 257/411; 257/412
(58) Field of Search ............................... 257/192, 194, 257/406, 410, 411, 412, 631

(56) References Cited

U.S. PATENT DOCUMENTS

| | | | |
|---|---|---|---|
| 5,294,818 A | | 3/1994 | Fujita et al. |
| 5,596,214 A | | 1/1997 | Endo |
| 6,392,257 B1 | * | 5/2002 | Ramdani et al. ............ 257/190 |
| 6,445,015 B1 | * | 9/2002 | Braddock ................... 257/192 |
| 2002/0047143 A1 | | 4/2002 | Ramdani et al. |
| 2002/0153524 A1 | * | 10/2002 | Yu et al. ........................ 257/43 |
| 2003/0102472 A1 | * | 6/2003 | Kelley et al. .................. 257/40 |

FOREIGN PATENT DOCUMENTS

| | | |
|---|---|---|
| EP | 0265314 | 4/1988 |
| EP | 0295490 | 12/1988 |
| WO | WO 02/41371 A1 | 5/2002 |

OTHER PUBLICATIONS

Chen et al., "Structural Reinvestigation of $BA_3ZR_2S_7$ By Single–Crystal X–Ray Diffraction," National Institute of Standards and Technology, pp. 161–163.

Wang et al., "Synthesis of $BaZrS_3$ By Short Time Reaction at Lower Temperatures," Journal of Allows and Compounds 327 (2001), pp. 104–112.

* cited by examiner

Primary Examiner—David Nelms
Assistant Examiner—Long Tran

(57) ABSTRACT

A semiconductor device includes a continuous doped substrate with a surface, a sulfur-based dielectric material layer positioned on the surface of the continuous doped substrate, a dielectric material layer positioned on the sulfur-based dielectric material layer, and a gate contact region positioned on the sulfur-based dielectric material layer. The continuous doped substrate includes silicon (Si) and the sulfur-based dielectric material includes a transition metal sulfide such as strontium zirconium sulfur (SrZrS), barium zirconium sulfur (BaZrS), strontium hafnium sulfur (SrHfS), barium hafnium sulfur (BaHfS), or the like. Further, the gate contact region includes a layer of one of strontium titanium sulfur (SrTiS), barium titanium sulfur (BaTiS), or the like positioned adjacent to the dielectric material layer.

29 Claims, 1 Drawing Sheet

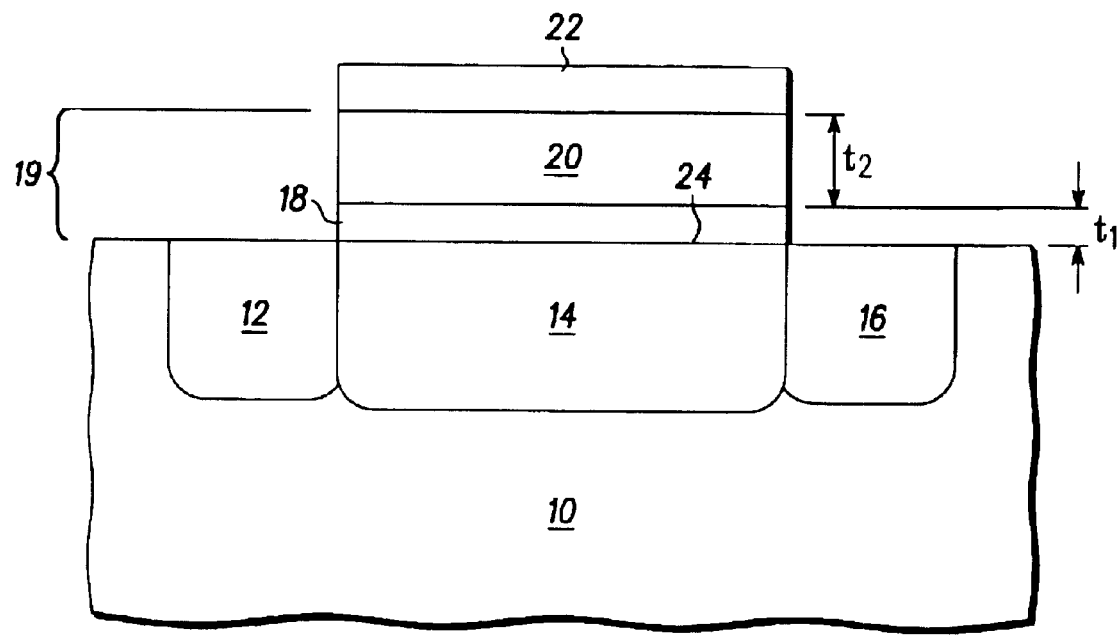
*- PRIOR ART -* *FIG. 1*
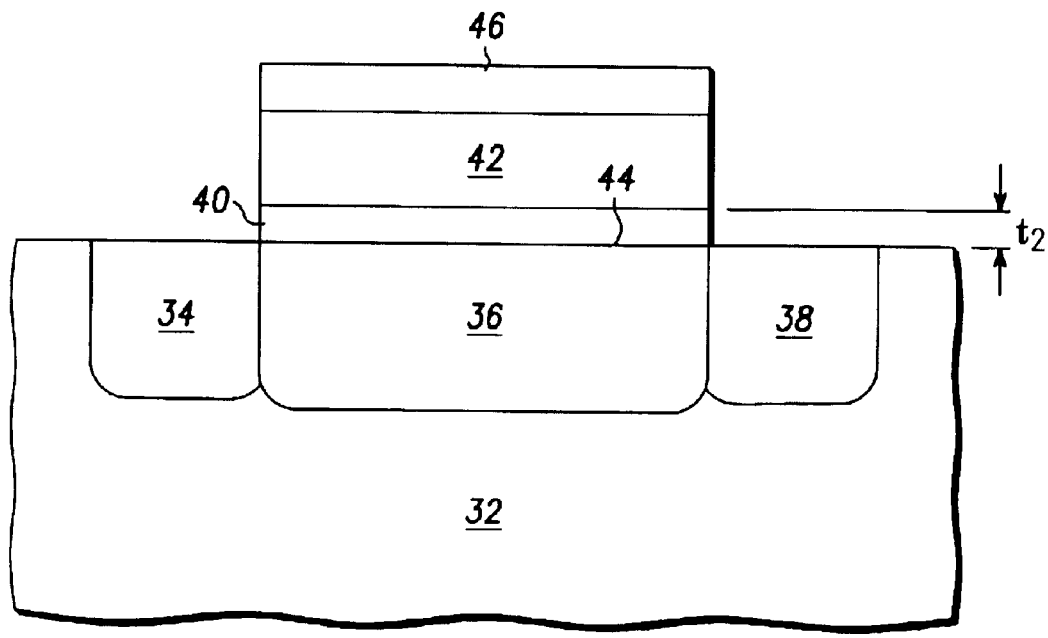
*FIG. 2*

SEMICONDUCTOR DEVICE STRUCTURES WHICH UTILIZE METAL SULFIDES

FIELD OF THE INVENTION

This invention relates generally to semiconductor device structures and methods for forming such and, more particularly, the present invention relates to using metal sulfides to improve semiconductor device structures.

BACKGROUND OF THE INVENTION

The semiconductor technology trend is to fabricate small, highly integrated semiconductor electronic devices. The most common semiconductor technology presently used is based on silicon. A large variety of semiconductor devices have been manufactured having various applicability and numerous disciplines. One such silicon-based semiconductor device is a metal-oxide-semiconductor field effect transistor (hereinafter referred to as "MOSFET").

FIG. 1 illustrates a MOSFET 5 typically found in the prior art. MOSFET 5 includes a substrate 10 wherein a channel 14 is formed. A heavily doped source 12 and a heavily doped drain 16 are formed within substrate 10 and adjacent to channel 14 and are respectively connected to source and drain terminals (not shown). MOSFET 5 further includes a gate dielectric region 19. Dielectric region 19 includes a oxide dielectric material layer 20 with a thickness $t_2$ positioned adjacent to channel 14 wherein a portion of oxide dielectric material layer 20 reacts with channel 14 to form a low permittivity interfacial oxide layer 18 with a thickness $t_1$ sandwiched therebetween channel 14 and layer 20.

A gate electrode 22, which acts as a conductor to which an input signal is typically applied via a gate terminal (not shown), is formed on oxide dielectric material layer 20. Gate electrode 22 typically includes a heavily doped poly-silicon layer. Further, channel 14 is formed within substrate 10 beneath gate electrode 22 and separates source 12 and drain 16. Channel 14 is typically lightly doped with a dopant type opposite that of source 12 and drain 16.

Gate electrode 22 is physically separated from substrate 10 by gate dielectric region 19, which, in the prior art, typically includes an oxide layer such as silicon oxide (Sio), zirconium oxide (ZrO), titanium oxide (TiO), zinc oxide (ZnO), or the like. Region 19 is provided to prevent current from flowing therebetween gate electrode 22 and source 12, drain 16, and channel 14. In operation, an output voltage is typically developed between source 12 and drain 16. When an input voltage is applied to gate electrode 22, a transverse electric field is set up in channel 14. By varying the transverse electric field, it is possible to modulate the conductance of channel 14 between source 12 and drain 16. In this manner an electric field controls the current flow through channel 14.

Semiconductor devices can be used as semiconductor memories. Most semiconductor memories use an array of tiny capacitors to store data. One approach to expanding the capacity of a memory chip is to shrink the area of each capacitor. However, everything else being equal, a smaller area capacitor stores less charge, thereby making it more difficult to integrate into a useful memory device. One approach to shrinking the capacitor area is to change to a storage dielectric material with a higher permittivity.

In another related area, one concern is the thickness of the gate dielectric used in conventional complimentary metal oxide semiconductor (hereinafter referred to as "CMOS") circuits. The current drive in a CMOS transistor is directly proportional to the gate capacitance. Since capacitance scales inversely with thickness, higher current drive requires continual reductions in thickness for conventional dielectrics. Present technology uses silicon oxide (SiO) based films with thicknesses near 3 nm. However projections suggest the need for 1 nm films for future small geometry devices. Silicon oxide (SiO) gate dielectrics in this thickness regime pose considerable challenges from a manufacturing perspective.

As MOSFET's are scaled beyond the 0.1 µm technology node, ultra thin silicon oxide (SiO) gate dielectrics, of less than 20 Å in thickness, exhibit significant leakage current (>1 A/cm²). In order to maintain high drive current, while minimizing leakage current, low equivalent oxide thickness is achieved by using thicker films of high permittivity gate dielectric. At these thicknesses, direct tunneling through the silicon oxide (SiO) may occur, although the effect of tunneling current on device performance may not preclude operation. Since the tunnel current depends exponentially on the dielectric thickness, small variations in process control may result in large variations in the tunnel current, possibly leading to localized reliability problems.

Silicon oxide (SiO) at these thicknesses also provides very little barrier to diffusion. Thus, the diffusion of boron (B) from doped poly-silicon gates, for example, would represent an increasingly difficult problem that might also require a move to new gate dielectrics or gate metals. The capacitance of a simple parallel plate dielectric with metal electrodes can be expressed as $$C = \frac{\varepsilon \varepsilon_o A}{t}, \qquad (1)$$

where $\varepsilon$ is the dielectric permittivity, $\varepsilon_0$ is the permittivity of free space, A is the capacitor area, and t is the dielectric thickness. In general, the increase in capacitance density (C/A) required for increasing current drive can be accomplished either by decreasing the dielectric thickness t or by increasing the dielectric permittivity $\varepsilon$ of the material. Thus, as with storage dielectrics, it is again desirable to change to a material with a higher permittivity.

The semiconductor industry has tried for several years to integrate high permittivity materials into integrated circuits. Although there has been much progress, these prior approaches each have drawbacks or limitations. One recurring problem is preventing unwanted layers from forming therebetween the substrate or first electrode and the high permittivity dielectric. Unless these layers also have a high permittivity, the overall capacitance is reduced. This can be shown clearly with an illustrative example. For this example, we will use one promising high permittivity dielectric candidate, tantalum oxide ($Ta_2O_5$) on a silicon (Si) layer. Other high permittivity dielectric materials will have different interfacial details, but will follow the same general analysis.

Tantalum oxide ($Ta_2O_5$) has a promising permittivity and reasonable band gap. However, the lower heat of formation relative to silicon dioxide ($SiO_2$) immediately suggests that tantalum oxide ($Ta_2O_5$) is not thermodynamically stable next to silicon (Si) and will decompose to silicon dioxide ($SiO_2$) at the interface. The capacitance of two dielectrics in series (such as a tantalum oxide ($Ta_2O_5$) dielectric layer on an interfacial silicon dioxide ($SiO_2$) layer) is given by $$\frac{1}{C} = \frac{1}{C_1} + \frac{1}{C_2}, \quad (2)$$

where $C_1$ and $C_2$ are the capacitances of the two layers. From Equation 1, we can write (assuming equal area capacitors)

$$\frac{t}{\varepsilon} = \frac{t_1}{\varepsilon_1} + \frac{t_2}{\varepsilon_2}, \quad (3)$$

where $t_1$, $t_2$ represent the thicknesses of the two layers, $\varepsilon_1$ and $\varepsilon_2$ represent the permittivities of the two layers, and $t$ and $\varepsilon$ are the "effective" thickness and permittivity of the stack.

A common parameter used to describe dielectric stacks is the equivalent oxide thickness of the capacitor. This is the theoretical thickness of silicon dioxide ($SiO_2$) that would be necessary to generate the same capacitance density as the material of interest (ignoring practical issues with thin silicon dioxide ($SiO_2$) films such as leakage or tunneling effects). Thus, $$t_{eq}(SiO_2) = \varepsilon(SiO_2)\left[\frac{t_1}{\varepsilon_1} + \frac{t_2}{\varepsilon_2}\right]. \quad (4)$$

If the interfacial layer $t_1$ is silicon dioxide ($SiO_2$), this equation would be rewritten as $$teq(SiO_2) = t_1 + t_2\left[\frac{\varepsilon(SiO_2)}{\varepsilon_2}\right]. \quad (5)$$

This equation shows that the equivalent (effective) oxide thickness of the stack (and hence the capacitance density) will be limited by the presence of a thin interfacial oxide. Thus, the effective oxide thickness will not be less than the thickness of the interfacial oxide. This minimum effective thickness is independent of the permittivity and thickness of the second layer.

High permittivity gate dielectrics typically used to form CMOS devices on silicon (Si) utilize transition metal oxides, such as (strontium, barium)-titanium-oxide ((Sr,Ba)TiO), (strontium, barium)-zirconium-oxide ((Sr,Ba)ZrO), (strontium-, barium)-hafnium-oxide ((Sr,Ba)HfO), or the like. Oxygen (O), however, will oxidize silicon (Si), which results in an interfacial silicon oxide (SiO) layer with a low dielectric constant. Further, the titanium (Ti) 3d state is resonant with the conduction band of silicon (Si) which results in a smaller conduction band offset. This smaller offset causes a high leakage current in CMOS devices.

Accordingly, it is an object of the present invention to provide a new and improved field effect device which can be used to form field effect devices with a lower gate leakage current.

SUMMARY OF THE INVENTION

To achieve the objects and advantages specified above and others, an improved semiconductor device which includes a sulfur-based perovskite material is disclosed. In a preferred embodiment, the semiconductor device includes a substrate with a surface and an insulating sulfur-based perovskite material layer positioned on the surface of the substrate. Further, in the preferred embodiment, a dielectric material layer is positioned on the insulating sulfur-based perovskite material layer and a gate contact region is positioned on the dielectric material layer.

In the preferred embodiment, the substrate includes silicon (Si) and the insulating sulfur-based perovskite material includes a transition metal sulfide such as strontium zirconium sulfur (SrZrS), barium zirconium sulfur (BaZrS), strontium hafnium sulfur (SrHfS), barium hafnium sulfur (BaHfS), or the like. Further, the gate contact region includes a metallic sulfur-based perovskite material layer such as strontium titanium sulfur (SrTiS), barium titanium sulfur (BaTiS), or the like.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 1 is a simplified cross-sectional view of a field effect device typically found in the prior art; and FIG. 2 is a simplified cross-sectional view of an improved field effect device in accordance with the present invention.

DETAILED DESCRIPTION OF THE PREFERRED EMBODIMENT

Referring specifically to FIG. 2, a cross-sectional view of an improved field effect device 30 is illustrated. Device 30 includes a substrate 32 with a surface 44 wherein a channel layer 36 is formed. In a preferred embodiment, substrate 32 includes silicon (Si) and channel layer 36 is p-type doped so that device 30 is an n-channel MOSFET. It will be understood, however, that an n-channel MOSFET is shown in this embodiment for illustrative purposes only and that it is anticipated that different embodiments could use other semiconductor device structures, such as a p-channel MOSFET, a MOS capacitor, or the like. Further, it will be understood that substrate 32 can include other supporting materials such as gallium arsenide (GaAs), indium phosphide (InP), or the like.

Device 30 also includes a heavily doped source 34 and a heavily doped drain 38. In the preferred embodiment, source 34 and drain 38 are heavily n-type doped and are formed within substrate 32 and adjacent to channel layer 36. An insulating sulfur-based dielectric material layer 40 with a thickness $t_2$ is formed on surface 44 adjacent to channel layer 36 whereon a dielectric material layer 42 is positioned. Further, a gate contact region 46 is positioned on dielectric material layer 42. In the preferred embodiment, thickness $t_2$ is typically within a range from approximately 5 Å to 20 Å. However, it will be understood that thickness $t_2$ can have values outside of this range.

In the preferred embodiment, dielectric material layer 42 includes at least one of strontium titanium oxide (SrTiO), barium strontium titanium oxide (BaSrTiO), lanthanum aluminum oxide (LaAlO), and another suitable dielectric material. In the preferred embodiment, insulating sulfur-based perovskite material layer 40 includes a suitable perovskite material layer such as a transition metal sulfide with a band gap energy, $E_g$, which includes strontium zirconium sulfide (SrZrS) ($E_g$(SrZrS) is typically within a range approximately from 0.6 eV to 2.0 eV), barium zirconium sulfide (BaZrS) ($E_g$(BaZrS) is typically within a range approximately from 0.6 eV to 2.0 eV), strontium hafnium sulfide (SrHfS) ($E_g$(SrHfS) is typically within a range approximately from 0.8 eV to 2.2 eV), barium hafnium sulfide (BaHfS) ($E_g$(BaHfS) is typically within a range approximately from 0.8 eV to 2.2 eV), or the like. Further, in the preferred embodiment, insulating sulfur-based perovskite material layer 40 includes a minimal amount of elemental oxygen (O) so that a low permittivity interfacial oxide (i.e. layer 18 from FIG. 1) is substantially prevented from forming between layer 40 and channel 36.

It will be understood that in this illustration, thickness, $t_2$, of insulating sulfur-based dielectric material layer 40 is assumed to be approximately equal to thickness, $t_2$, of oxide dielectric material layer 20 in FIG. 1 for reasons to be discussed presently. As thickness $t_1$ approaches zero, Equation (3) can be rewritten as $$\frac{t}{\varepsilon} = \frac{t_2}{\varepsilon_2}, \quad (6)$$

wherein the "effective" permittivity is now limited by the permittivity of the high permittivity material. Further, Equation (2) can be rewritten as $$\frac{1}{C} = \frac{1}{C_2}, \quad (7)$$

where the total capacitance is approximately the capacitance of sulfur-based perovskite material layer 40, as desired.

Returning to the analysis of the equivalent oxide thickness of the capacitor, Equation (4) can be rewritten as $$t_{eq}(\text{S based dielectric}) = \varepsilon(\text{S based dielectric})\left[\frac{t_2}{\varepsilon_2}\right], \quad (8)$$

where $t_{eq}$(S based dielectric) is no longer limited by the presence of a thin interfacial oxide. Thus, the effective oxide thickness can now be reduced and is dependent on the permittivity and thickness of the high permittivity sulfur-based perovskite material.

In a similar embodiment, gate electrode region 46 can include a metallic sulfur-based perovskite material layer which is substantially conducting and positioned adjacent to dielectric material layer 42. Suitable metallic sulfur-based perovskite material layers include transition metal sulfides such as strontium titanium sulfur (SrTiS), barium titanium sulfur (BaTiS), or the like. The advantage of using the metallic sulfur-based perovskite material layer is the improvement in lattice matching with dielectric material layer 42. Lattice matched materials typically have fewer defects which will reduce Fermi level pinning effects.

Thus, an improved semiconductor device is disclosed which includes a sulfur-based perovskite material layer. An advantage of this device is the elimination of a low permittivity interfacial oxide layer 18 sandwiched between channel 14 and oxide dielectric material layer 20. Further, the use of a high dielectric material layer and the elimination of an interfacial oxide layer decreases the gate leakage current and also increases the capacitance of the field effect device as the device is scaled to smaller dimensions.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A semiconductor device comprising:
    a substrate with a surface;
    an insulating ternary alloy of an alkaline earth transition metal and a sulfur-based materiel layer positioned on the surface of the substrate;
    a dielectric material layer positioned on the insulating ternary alloy of an alkaline earth transition metal and sulfur-based material layer; and
    a gate contact region positioned on the dielectric material layer.

2. A device as claimed in claim 1 wherein the substrate includes at least one of silicon, gallium arsenide, indium phosphide, and another suitable supporting material.

3. A device as claimed in claim 1 wherein the insulating ternary alloy of an alkaline earth transition metal and sulfur-based material layer includes at least one of strontium zirconium sulfide, barium zirconium sulfide, strontium hafnium sulfide, barium hafnium sulfide, and another suitable sulfur-based material with a desired electrically insulating property.

4. A device as claimed in claim 1 wherein the insulating ternary alloy of an alkaline earth transition metal and sulfur-based material layer includes at least one of zirconium, titanium, hafnium, and alloys thereof.

5. A device as claimed in claim 1 wherein the insulating ternary alloy of an alkaline earth transition metal and sulfur-based material layer includes at least one of strontium, barium, and another suitable element.

6. A device as claimed in claim 1 wherein the insulating ternary alloy of an alkaline earth transition metal and sulfur-based material layer includes one of sulfur and alloys thereof.

7. A device as claimed in claim 1 wherein the insulating ternary alloy of an alkaline earth transition metal and sulfur-based material layer has a thickness of approximately 5 Å to 20 Å.

8. A device as claimed in claim 1 wherein the gate contact region includes a metallic sulfur-based material layer.

9. A device as claimed in claim 8 wherein metallic sulfur-based material layer includes one of strontium titanium sulfide, barium titanium sulfide, and another suitable sulfur-based material layer with a desired conductive property.

10. A device as claimed In claim 1 wherein the dielectric material layer includes at cost one of strontium titanium oxide, barium strontium titanium oxide, lanthanum aluminum oxide, and another suitable dielectric material with a desired permittivity.

11. A semiconductor field effect device comprising:
    a substrate with a surface;
    a dielectric material region positioned on the surface of the substrate wherein the dielectric material region includes an insulating ternary alloy of an alkaline earth transition metal and sulfur-based perovskite material layer positioned adjacent to the surface of the substrata; and
    a conductive contact region positioned on the dielectric material region.

12. A device as claimed in claim 11 wherein the substrate includes at least one of silicon, gallium arsenide, indium phosphide, and another suitable supporting material.

13. A device as claimed in claim 11 wherein the insulating ternary alloy of a alkaline earth transition metal and sulfur-based perovskite material layer includes at least one of strontium zirconium sulfuide, barium zirconium sulfuide, strontium hafnium sulfuide, barium hafnium sulfuide, and another suitable sulfur-based perovskite material with a desired electrically insulating property.

14. A device as claimed in claim 11 wherein the dielectric material region includes at least one of zirconium, titanium, hafnium, barium, lanthanum, strontium and combinations thereof.

15. A device as claimed in claim 14 wherein the dielectric material region includes one of sulfur and alloys thereof.

16. A device as claimed in claim 11 wherein the insulating ternary alloy of an alkaline earth transition metal and sulfur-based perovskite material layer has a thickness of approximately 5 Å to 20 Å.

17. A device as claimed in claim 11 wherein the conductive contact region includes a metallic sulfur-based perovskite material layer.

18. A device as claimed in claim 17 wherein the metallic sulfur-based perovskite material layer includes one of strontium titanium sulfide, barium titanium sulfide, and another suitable sulfur-based perovskite material layer with a desired conductivity property.

19. A device as claimed in claim 11 wherein the dielectric material region includes at least one of strontium titanium oxide, barium strontium titanium oxide, lanthanum aluminum oxide, and another suitable dielectric material, with a desired permittivity.

20. An integrated circuit having a field effect device fabricated thereon, the field effect device comprising:
   a substrate with a surface;
   a continuous doped layer within the substrate and positioned adjacent to the surface;
   an insulating ternary alloy of an alkaline earth transition metal and sulfur-based perovskite material layer positioned on the surface of the substrate and proximate to the continuous doped layer;
   a dielectric material region positioned on the insulating ternary alloy of an alkaline earth transition metal and sulfur-based perovskite material layer; and
   a gate contact region positioned on the dielectric material region.

21. A device as claimed in claim 20 wherein the substrate includes at least one of silicon, gallium arsenide, indium phosphide, and another suitable supporting material.

22. A device as claimed in claim 20 wherein the insulating ternary alloy of an alkaline earth transition metal and sulfur-based perovskite material layer includes at least one of strontium zirconium sulfide, barium zirconium sulfide, strontium hafnium sulfide, barium hafnium sulfide, and another suitable sulfur-based perovskite material with a desired electrically insulating property.

23. A device so claimed in claim 20 wherein the insulating ternary alloy of an alkaline earth transition metal and sulfur-based perovskite material layer includes at least one of zirconium, titanium, and hafnium.

24. A device as claimed In claim 23 wherein the insulating ternary alloy of an alkaline earth transition metal and sulfur-based perovskite material layer includes at least one of strontium, barium, and another sultable element.

25. A device as claimed in claim 24 wherein the insulating ternary alloy of an alkaline earth transition metal a sulfur-based perovskite material layer includes one of sulfur and alloys thereof.

26. A device as claimed in claim 20 wherein the insulating ternary alloy of an alkaline earth transition metal and sulfur-based perovskite material layer has a thickness of approximately 5 Å to 20 Å.

27. A device as claimed in claim 20 wherein the gate contact region includes a metallic sulfur-based material layer.

28. A device as claimed in claim 27 wherein metallic sulfur-based perovskite material layer includes one of strontium titanium sulfide, barium titanium sulfide, and another suitable sulfur-based perovskite material with a desired conductive property.

29. A device as claimed in claim 20 wherein the dielectric material region includes at least one of strontium titanium oxide, barium strontium titanium oxide, lanthanum aluminum oxide, and another suitable dielectric material with a desired permittivity.

* * * * *